United States Patent
Ramanan et al.

(10) Patent No.: US 8,704,587 B2
(45) Date of Patent: Apr. 22, 2014

(54) CONFIGURABLE MULTISTAGE CHARGE PUMP USING A SUPPLY DETECT SCHEME

(75) Inventors: Karthik Ramanan, Austin, TX (US); Jeffrey C. Cunningham, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/555,848

(22) Filed: Jul. 23, 2012

(65) Prior Publication Data

US 2014/0022005 A1 Jan. 23, 2014

(51) Int. Cl.
  *G05F 1/62* (2006.01)
  *H02M 3/18* (2006.01)

(52) U.S. Cl.
  USPC .................. 327/536; 363/59; 365/189.09

(58) Field of Classification Search
  None
  See application file for complete search history.

(56) References Cited

U.S. PATENT DOCUMENTS

| | | | |
|---|---|---|---|
| 6,297,687 B1 * | 10/2001 | Sugimura | 327/536 |
| 6,486,728 B2 * | 11/2002 | Kleveland | 327/536 |
| 6,760,262 B2 * | 7/2004 | Haeberli et al. | 365/189.09 |
| 6,927,441 B2 | 8/2005 | Pappalardo et al. | |
| 7,956,673 B2 | 6/2011 | Pan | |

* cited by examiner

*Primary Examiner* — Lincoln Donovan
*Assistant Examiner* — Terry L Englund
(74) *Attorney, Agent, or Firm* — Gary Stanford

(57) ABSTRACT

A configurable multistage charge pump including multiple pumpcells, at least one bypass switch and control logic. The pumpcells are coupled together in series including a first pumpcell receiving an input voltage and at least one remaining pumpcell including a last pumpcell which generates an output voltage. Each bypass switch is coupled to selectively provide the input voltage to a pumpcell input of a corresponding one of the remaining pumpcells. The control logic is configured to determine one of multiple voltage ranges of the input voltage, to enable each pumpcell for a first voltage range and to disable and bypass at least one pumpcell for at least one other voltage range. A method of operating a multistage charge pump including detecting an input voltage, selecting a voltage range based on an input voltage, and enabling a number of cascaded pumpcells corresponding to the selected voltage range.

19 Claims, 3 Drawing Sheets

CONFIGURABLE MULTISTAGE CHARGE PUMP USING A SUPPLY DETECT SCHEME

BACKGROUND OF THE INVENTION

1. Field of the Invention

This disclosure relates generally to a configurable multistage charge pump including a supply detect mechanism.

2. Description of the Related Art

Non-Volatile Memory (NVM) bitcells, among other applications, often utilize configurable and adaptable medium and high voltage generation techniques in order to meet cycling and data retention targets. These targets typically include controlled ramp rates and programmable output voltage and current levels, along with programmable pulse duration and recovery. In addition to the objectives for configurable voltage pulses, there may also be a need to adapt to a widely varying input supply level, particularly in the area of battery powered systems.

BRIEF DESCRIPTION OF THE DRAWINGS

These and other objects, features, and advantages of the present invention will become better understood with regard to the following description, and accompanying drawings where.

DETAILED DESCRIPTION

Figure 1:
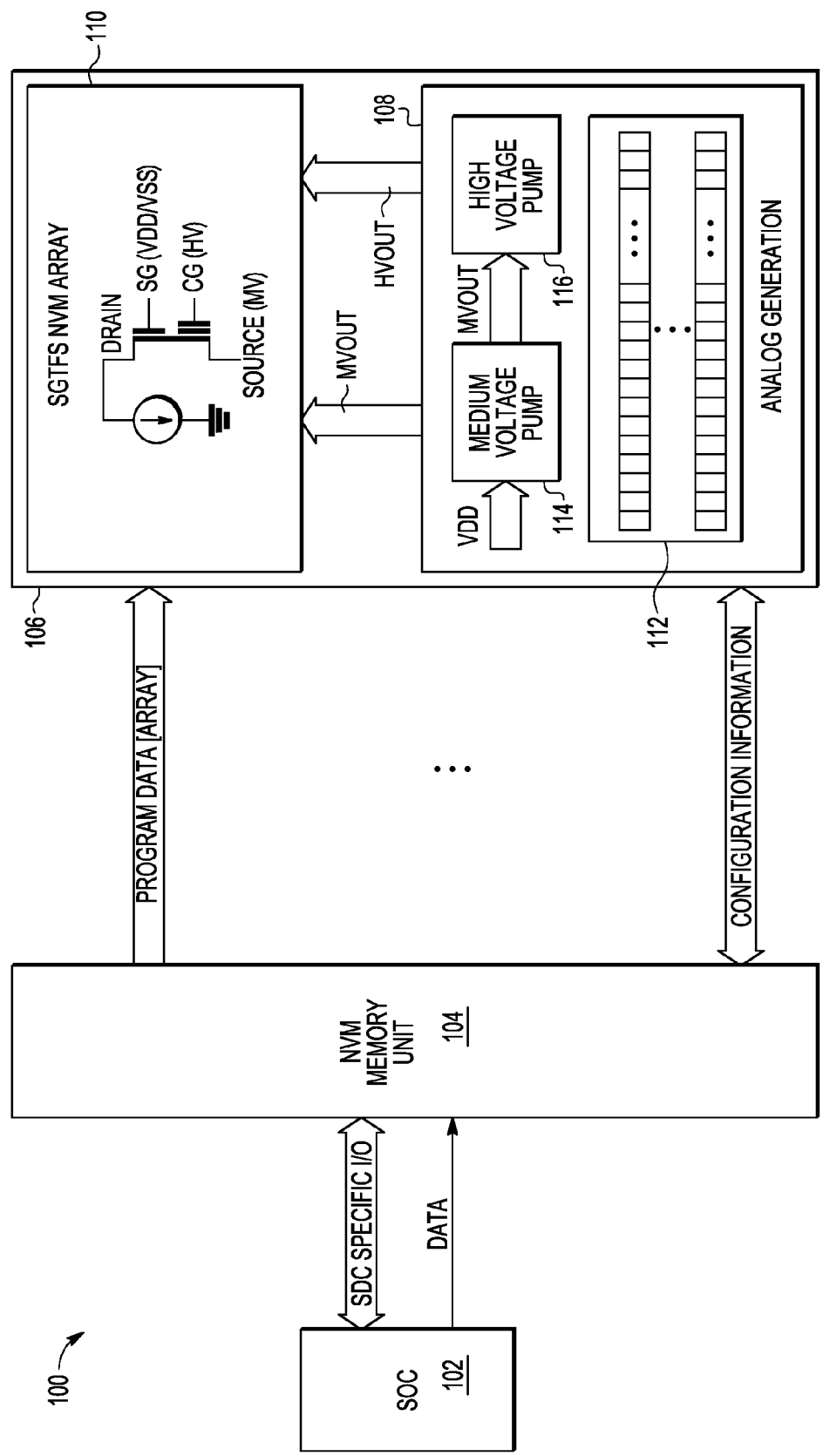
FIG. 1 is a block diagram of a processing system incorporating a non-volatile semiconductor memory device in accordance with one embodiment.

Exemplary and illustrative embodiments are described below. In the interest of clarity, not all features of an actual implementation are described in this specification, for in the development of any such actual embodiment, numerous implementation-specific decisions are made to achieve specific goals, such as compliance with system related and business related constraints, which vary from one implementation to another. Furthermore, such a development effort might be complex and time consuming, but would nevertheless be a routine undertaking for those having the benefit of this disclosure. Various modifications will be apparent, and the general principles defined herein may be applied to other embodiments.

Embodiments will now be described with reference to the attached figures. Various structures, systems, and devices are schematically depicted in the drawings for purposes of explanation only. Nevertheless, the attached drawings are included to describe and explain illustrative examples. The words and phrases used herein should be understood and interpreted to have a meaning consistent with the understanding of those words and phrases in the relevant art. No special definition of a term or phrase, i.e., a definition that is different from the ordinary and customary meaning, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

For a wide input supply voltage with a variable load range, it may be deemed impractical to implement a charge pump having a fixed number of stages and/or a fixed capacity. Such a charge pump would result in insufficient load drive or high ripple, depending upon which end of the input supply range at which the charge pump is operated. Yet, it has been noted that a wide input supply range is common in many configurations, including, for example, a battery powered system. Accordingly, there is an increasing need for voltage generation mechanisms that meet system objectives for output voltage and current levels, while providing such under a wide range of input supply levels. Thus it is desirable to provide a configurable multistage charge pump that senses the input supply level and correspondingly configures the number of pumpcell stages and the capacity of the configurable multistage charge pump in order to overcome the aforementioned problems.

A configurable multistage charge pump with supply detect capability is disclosed herein, and such a mechanism is highly desirable in applications that exhibit a significant output load swing in the presence of a wide input supply range. One embodiment is thus disposed in a processing system utilizing non-volatile memory (NVM) circuits where the load is dependent upon the number of bitcells that are programmed, and where the input supply may be a battery having a wide voltage range. Accordingly, embodiments are disclosed in such an application for the sake of clarity, but it is noted that application of the configurable multistage charge pump is not to be restricted to processing systems utilizing NVM circuits.

FIG. 1 is a block diagram of a processing system 100 incorporating a non-volatile semiconductor memory device in accordance with one embodiment. The processing system 100 includes a system-on-chip (SOC) 102, an NVM memory unit 104, and an NVM hardblock 106. The SOC 102 can be a system-on-a-chip or other suitable data processor. The SOC 102 may include one or more processing cores, cache memory units, memory management units, random access memory, signal processing components, and/or other suitable components. An example of an SOC 102 that may be employed in the processing system 100 is the Kinetis microcontroller commercially available from Freescale Semiconductor, Inc. of Austin, Tex.

The hardblock 106 may include a memory array 110. In addition the hardblock 106 may include an analog generation unit or configurable multistage charge pump system 108 that provides one or more levels of voltage to program and erase bitcells in the memory array 110, one of which is depicted in exemplary fashion in the memory array 110. The memory array 110 may be any suitable type of non-volatile memory such as, but not limited to, flash memory. In some embodiments, the memory array 110 includes split gate bitcells with nanocrystal storage elements, such as, but not limited to, the Thin Film Storage (TFS) memory array commercially available from Freescale Semiconductor, Inc. of Austin, Tex.

The NVM memory unit 104 acts as an interface between the SOC 102 and the hardblock 106 by converting information from the SOC 102 for use by hardblock 106, and vice versa. The NVM memory unit 104 may be used by the SOC 102 for a variety of purposes for controlling the hardblock 106. These purposes include program code storage, storage for data tables, and/or for byte write/erase system data. As shown, the NVM memory unit 104 provides configuration information and programming data for the memory array 110 within the hardblock 106.

The analog generation unit 108 within the hardblock 106 may include calibration and trim data registers 112, a medium voltage pump 114, and a high voltage pump 116. The calibration and trim data registers 112 may store charge pump configuration information supplied by the NVM memory unit 104. The medium voltage pump 114 receives an input source voltage VDD and provides a medium voltage output MVOUT to an input of the high voltage pump 116 and to the source of the bitcells in the memory array 110. The high voltage pump 116 receives MVOUT and provides a high voltage output HVOUT to a control gate (CG) of the bitcells in the memory array 110. The bitcells may also have a select gate (SG) receiving supply voltage levels VDD and/or VSS. Further details of the configuration and operation of the processing system 100 are not provided as being beyond the scope of the present disclosure and not necessary for a full and complete understanding of a configurable multistage charge pump using a supply detect scheme as disclosed herein.

The supply voltage VDD may be provided from a battery or any other voltage source and exhibits a relatively wide voltage range. In one embodiment, for example, VDD ranges from 1.7 volts (V) to 3.6V, although other voltage levels and voltage ranges are contemplated in other configurations. The medium output voltage MVOUT of the medium voltage pump 114 has a voltage level suitable for the memory array 110 and the high voltage pump 116. In one embodiment, MVOUT is within a voltage range of 5V to 6V, such as, for example, approximately 5.5V, although other voltage levels and voltage ranges are contemplated in other configurations. The high voltage pump 116 receives MVOUT and boosts the voltage HVOUT to a higher voltage level suitable for the memory array 110, such as, for example, approximately 15V, in which other voltage levels and voltage ranges are contemplated in other configurations.

The memory array 110 exhibits a relatively wide and variable load range. In one embodiment, for example, the medium voltage pump 114 alone may have to supply a load current of a few microamperes (µA) to up to 600 µA or greater. Conventional charge pump configurations with a fixed number of stages and/or fixed capacity provided either insufficient load drive or high ripple output voltage. Higher ripple of the MVOUT voltage caused unintended and undesired disturbances of the program bits and an under-capacity charge pump compromised program parallelism. In one embodiment, for example, it may be desired to program up to 72 bits or more in which each bitcell receives substantially the same voltage and current levels within an acceptable tolerance range. Conventional charge pump configurations optimized for a particular input voltage level and/or load levels exhibited undesired characteristics when the input and/or the load was varied significantly outside the optimized input and load conditions.

Figure 2:
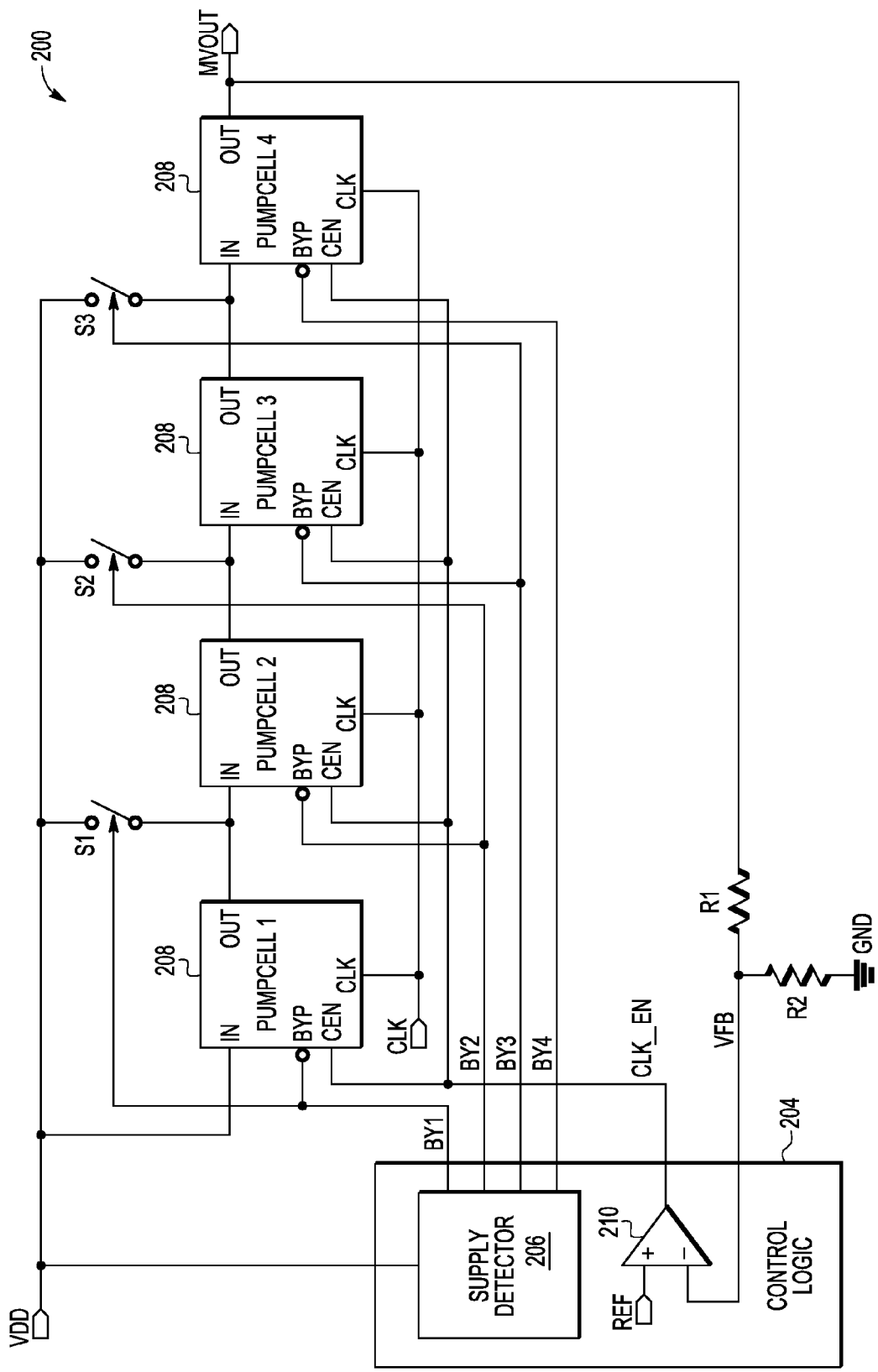
FIG. 2 is a block diagram of a configurable multistage charge pump according to one embodiment which may be used as the medium voltage pump of FIG. 1.

FIG. 2 is a block diagram of a configurable multistage charge pump 200 according to one embodiment which may be used as the medium voltage pump 114 of FIG. 1. As described further herein, the configurable multistage charge pump 200 includes a number of pumpcell stages coupled in series (e.g., cascaded), and automatically configures or enables the number of pumpcell stages and corresponding capacity based on the voltage level of MVOUT. The configurable multistage charge pump 200 is capable of providing an output with low ripple and requested load current despite operating within a relatively wide and variable load range with a wide input voltage range.

The configurable multistage charge pump 200 includes control logic 204 which further includes a supply detector 206 and a voltage comparator 210. The supply detector 206 receives the input supply voltage VDD and controls the states of four bypass signals BY1-BY4 based on the voltage level of VDD. BY1 is provided to an inverted bypass input BYP of a first pumpcell ("PUMPCELL 1") 208, and also to a control input of a first bypass switch S1. BY2 is provided to an inverted bypass input BYP of a second pumpcell ("PUMPCELL 2") 208, and also to a control input of a second bypass switch S2. BY3 is provided to an inverted bypass input BYP of a third pumpcell ("PUMPCELL 3") 208, and also to a control input of a third bypass switch S3. BY4 is provided to an inverted bypass input BYP of a fourth pumpcell ("PUMPCELL 4") 208.

VDD is also provided to an input IN of the PUMPCELL 1 208 and to a first switched terminal of each of the bypass switches S1, S2 and S3. An output OUT of PUMPCELL 1 208 is coupled to an input IN of PUMPCELL 2 208 and to a second switched terminal of the bypass switch S1. An output OUT of PUMPCELL 2 208 is coupled to an input IN of PUMPCELL 3 208 and to a second switched terminal of the bypass switch S2. An output OUT of PUMPCELL 3 208 is coupled to an input IN of PUMPCELL 4 208 and to a second switched terminal of the bypass switch S3. An output OUT of PUMPCELL 4 208 provides the medium voltage output signal MVOUT.

Each of the bypass switches S1-S3 are shown as a normally-open single-pole, single-throw (SPST) switches with a control input receiving a corresponding one of the bypass signals BY1-BY3. Each SPST switch may be implemented using transistor devices, such as metal-oxide semiconductor (MOS) transistors or field-effect transistors (FETs) or the like. When the corresponding bypass signal BY1-BY3 is low, the corresponding bypass switch S1-S3 is opened, and when the corresponding bypass signal BY1-BY3 is high, the corresponding bypass switch S1-S3 is closed. The inverted bypass input BYP of each of the pumpcells 208 enables operation of the pumpcell when deasserted low and disables operation of the pumpcell when asserted high.

The output MVOUT of PUMPCELL 4 208 is provided to a first terminal of a first resistor R1. A second terminal of R1 is coupled to the negative ("−") input of the comparator 210 and to a first terminal of a second resistor R2. A second terminal of R2 is coupled to ground (GND). GND represents any suitable common or reference voltage level. A voltage reference signal REF is provided to the positive input ("+") of the comparator 210. The comparator 210 outputs a clock enable signal CLK_EN which is provided to clock enable inputs CEN of each of the pumpcells 208.

A pump clock signal CLK is provided to clock inputs CLK for each of the four pumpcells 208. The pump clock signal CLK may be developed on chip or may be supplied from an external source. In one embodiment, the pump clock signal CLK is a 50 megahertz (MHz) clock signal having an approximately 50 percent duty cycle.

To clearly disclose operation of the configurable multistage charge pump, an embodiment comprising four stages is described below. Although specific input voltage levels, supply ranges, and an output voltage are described, it is noted that such levels are merely exemplary and are set forth to teach relevant principles of the embodiment.

Operationally, the supply detector 206 determines the voltage level of the input supply voltage VDD and determines one of one or more ranges into which the input supply voltage VDD falls. In the embodiment shown, the configurable multistage charge pump 200 comprises four stages corresponding to PUMPCELL 1 208, PUMPCELL 2 208, PUMPCELL 3 208, and PUMPCELL 4 208. Accordingly, the supply detector 202 determines one of four ranges for the input supply voltage VDD, which in turn determines the number of pumpcells 208 that are to be enabled when generating a voltage pulse of a specified duration and load capacity. In a specific 4-stage embodiment configured to provide an output voltage MVOUT of approximately 5.5V, where the range of VDD varies from 1.7V to 3.6V, the four input voltage ranges determined by the supply detector 206 are as shown in the following Table 1:

TABLE 1

Input Voltage Ranges for 4-Stage Configurable Multistage Charge Pump

| Input Voltage Level (Volts) | Range Indication (Number of Pumpcells) |
| --- | --- |
| 1.7-2.2 | 4 |
| 2.2-2.7 | 3 |
| 2.7-3.2 | 2 |
| 3.2-3.6 | 1 |

During periods that the configurable multistage charge pump 200 is not used, the control logic 204 may assert the four bypass signals BY1-BY4 high, thereby disabling all four pumpcells 208. Although a logic low state is shown in the diagram as a deasserted state, it is noted that such is merely shown to teach relevant aspects of the embodiments, and very negligible modifications are required to employ complementary logic levels.

During periods that the configurable multistage charge pump 200 is active, the supply detector 206 selectively asserts the four bypass signals BY1-BY4 in accordance with the voltage level of VDD. For an input voltage VDD in which all four pumpcells 208 are used (i.e., an input voltage level of 1.7-2.2 volts), the supply detector 206 deasserts BY1-BY4 low, thus enabling all four pumpcells 208 and opening the bypass switches S1-S3. VDD is thus boosted through all four pumpcells 208, resulting in a boosted output voltage level at output MVOUT.

For an input voltage VDD in which only three pumpcells 208 are used (i.e., an input voltage level of 2.2-2.7 volts), the supply detector 206 asserts BY1 and deasserts BY2-BY4. Assertion of BY1 disables PUMPCELL 1 208 and closes bypass switch S1, thus routing VDD to the input IN of PUMPCELL 2 208. VDD is thus boosted through PUMPCELL2-PUMPCELL4 208, resulting in a boosted output voltage level at output MVOUT for the indicated input voltage range.

For an input voltage VDD in which only two pumpcells 208 are used (i.e., an input voltage level of 2.7-3.2 volts), the supply detector 206 asserts BY1 and BY2 and deasserts BY3-BY4. Assertion of BY1-BY2 disables PUMPCELL 1 208 and PUMPCELL 2 208, and closes both bypass switches S1 and S2, thus routing VDD to the input IN of PUMPCELL 2 208 and the input IN of PUMPCELL 3 208, but since PUMPCELL 2 208 is disabled, VDD is thus boosted through PUMPCELL3-PUMPCELL4 208, resulting in a boosted output voltage level at output MVOUT for the indicated input voltage range.

For an input voltage VDD in which only one pumpcell 208 is used (i.e., an input voltage level of 3.2-3.6 volts), the supply detector 206 asserts BY1-BY3 and deasserts BY4. Assertion of BY1-BY3 disables PUMPCELL 1-PUMPCELL 3 208, and closes S1-S3, thus routing VDD to the inputs IN of PUMPCELL 2-PUMPCELL 4 208, but since PUMPCELL 2-PUMPCELL 3 208 are disabled, VDD is thus boosted only through PUMPCELL4 208, resulting in a boosted output voltage level at output MVOUT for the indicated input voltage range.

The output voltage signal MVOUT is divided down by resistors R1 and R2 to provide a feedback sense signal VFB for the comparator 210 indicative of the actual output voltage level, and the reference signal REF is chosen such that it is representative to the desired voltage level. When VFB rises above REF, indicating that MVOUT has exceeded the target voltage level (e.g., 5.5V), then signal CLK_EN is deasserted low. In response to deassertion of CLK_EN, the pumpcells 208 are disabled. When the level of MVOUT decreases to a level below the target voltage level, CLK_EN is asserted, thus allowing the bypass signals BY1-BY4 to enable selected ones of the pumpcells 208. In one embodiment, sufficient hysteresis is provided by the comparator 210 to avoid undesired oscillation of the configurable multistage charge pump 200 during operation.

Although a four-stage embodiment of the configurable multistage charge pump 200 is discussed with reference to FIG. 2, it is noted that this configuration is disclosed in order to teach features of the embodiment with clarity. However, the embodiment is not restricted to only a 4-stages; alternative embodiments may include any number of stages greater than two stages, commensurate with the input supply operating range and target output voltage level. These alternative embodiments contemplate the supply detector 206 having bypass signals that correspond to controlling the two or more stages.

In addition to embodiments comprising other than four stages, differing numbers of pumpcells 208 disposed in parallel within individual stages is also contemplated. By disposing varying numbers of pumpcells 208 in each of the stages, varying levels of voltage boost and drive current can be achieve to provide for configuration of a desired voltage pulse at MVOUT for a given application, such as may be prescribed via one or more of the configuration registers 112 of FIG. 1.

Figures 3, 4:
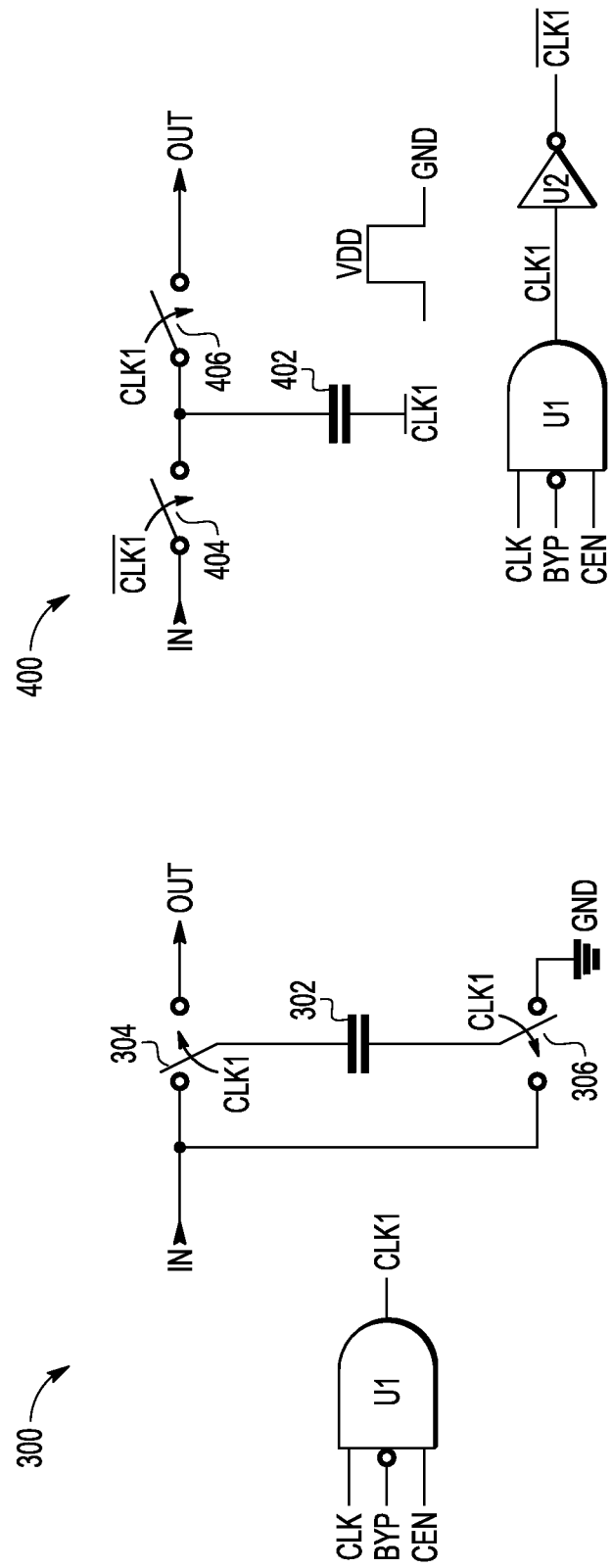
FIG. 3 is a block diagram of an exemplary charge pump cell which may be used as any one or more of the pumpcells of charge pump of FIG. 2.
FIG. 4 is a block diagram of an alternative charge pump cell which may be used as any one or more of the pumpcells of charge pump of FIG. 2.

FIG. 3 is a block diagram of an exemplary charge pump cell (or, "pumpcell") 300 which may be used as any one or more of the pumpcells 208 of configurable multistage charge pump 200. The pumpcell 300 includes a switch 304 configured as a single-pole, double throw (SPDT) switch having a common terminal coupled to a first electrode of a capacitor 302. A first switched terminal of the switch 304 is coupled to an input voltage IN and a second switched terminal is coupled to an output voltage OUT. A second electrode of the capacitor 302 is connected to a common terminal of another switch 306 also configured as a SPDT switch. A first switched terminal of the switch 306 is coupled to GND and a second switched terminal is coupled to the input voltage IN. Switches 304 and 306 each have a control terminal receiving a clock signal CLK1, which is provided by the output of an AND gate U1. The CLK input is provided as a first input of AND gate U1, which receives the BYP input at a second, inverting input and the clock enable input CEN at a third input. BYP and CEN represent the BYP and CEN inputs of each of the pumpcells 208 receiving a corresponding bypass signal (BY1-BY4) and clock enable signal CLK_EN from the control logic 204 previously described.

In operation, when BYP is low and CEN is high, signal CLK1 is driven in synchronization with clock signal CLK. Consider that CLK1 has toggled switch 304 to the input voltage IN and switch 306 to GND. In this phase of CLK1, the capacitor 302 charges to the input voltage IN. In the next phase of CLK1, the states of the switches 304, 306 reverse so that switch 304 couples one end of the capacitor 302 to the output voltage OUT and the switch 306 couples the other end of the capacitor 302 to the input voltage IN. Thus, the previously charged voltage (IN) on the capacitor 302 is coupled to the output voltage terminal OUT and is boosted by the value of the input voltage IN. As a result, a switched capacitor pumpcell is created and a total output voltage value of two times IN (assuming no loss) is provided at the output terminal OUT.

It is appreciated that losses may be incurred due to various parameters and conditions (e.g., switching losses, load level, capacitor size, etc.) and it is noted that these losses should be provided for in selection of number of stages and pumpcells within individual stages. In another embodiment, the second terminal of switch 306 may be connected to a voltage different from the value of IN, and the resultant output voltage OUT with be equal to the sum of the input voltage IN and the different voltage.

The functions described above for the pumpcell 300 occur when BYP is low and CEN is high. Otherwise, operation of the pumpcell 300 is disabled. Accordingly, the bypass signals BY1-BY4 and the clock enable signal CLK_EN of the configurable multistage charge pump 200 of FIG. 2 are employed to selectively enable and disable the pumpcells 208, thus providing for generation of output voltage MVOUT in the presence of a widely varying input voltage VDD.

FIG. 4 is a block diagram of an alternative charge pump cell (or, "pumpcell") 400 which may be used as any one or more of the pumpcells 208 of configurable multistage charge pump 200 of FIG. 2. The pumpcell 400 includes a switch 404 configured as a SPST switch having a first terminal for receiving the input voltage and a second terminal that is coupled to a first electrode of a capacitor 402 and to a first terminal of a second SPST switch 406. A second electrode of the capacitor 402 is coupled to CLK1 provided at the output of AND gate U1. The second terminal of switch 406 provides the output voltage OUT. Again, CLK is provided as a first input of AND gate U1. BYP is provided to a second, inverting input of U1 and CEN is provided to a third input of U1. The output of the AND gate U1 provides CLK1. CLK1 is further provided to an inverter U2 that provides a complementary clock signal $\overline{CLK1}$. $\overline{CLK1}$ is provided to a control input of switch 404 and CLK1 is provided to a control input of switch 406. CLK1 and $\overline{CLK1}$ both switch between GND and a supply voltage VDD, which may be VDD in one embodiment.

In operation, when BYP is low and CEN is high, signal CLK1 is driven in synchronization with clock signal CLK and signal $\overline{CLK1}$ is driven complementary to signal CLK1. Consider first that $\overline{CLK1}$ is high so that switch 404 is closed and CLK1 is low so that switch 406 is opened. In this phase, the capacitor 402 charges to the voltage of IN. In the next phase of CLK1, the states of the clock signals CLK1, $\overline{CLK1}$ and switches 404, 406 reverse. Thus, switch 404 is opened and switch 406 is closed. Furthermore, CLK1 at the lower electrode of the capacitor 402 is high, so that the voltage of OUT becomes IN+VDD. As a result, a switched capacitor pumpcell is created and a total output voltage value of VDD plus IN (assuming no loss) is provided at the output terminal OUT. Again, losses may be incurred due to various parameters and conditions (e.g., switching losses, load level, capacitor size, etc.) and it is noted that these losses should be provided for in selection of number of stages and pumpcells within individual stages.

The functions described above for the pumpcell 400 occur when BYP is low and CEN is high. Otherwise, operation of the pumpcell 400 is disabled. Accordingly, the bypass signals BY1-BY4 and the clock enable signal CLK_EN of the pumpcell 400 of FIG. 3 may be used to selectively enable and disable the pumpcells 208, thus providing for generation of output voltage MVOUT in the presence of a widely varying input voltage VDD.

A configurable multistage charge pump according to one embodiment includes multiple pumpcells, at least one bypass switch and control logic. The pumpcells are coupled together in series including a first pumpcell receiving an input voltage and at least one remaining pumpcell including a last pumpcell which generates an output voltage. Each bypass switch is coupled to selectively provide the input voltage to a pumpcell input of a corresponding one of the remaining pumpcells. The control logic is configured to determine one of multiple voltage ranges of the input voltage, to enable each pumpcell for a first voltage range and to disable and bypass at least one pumpcell for at least one other voltage range.

A method of operating a multistage charge pump according to one embodiment includes detecting an input voltage, selecting a voltage range based on a level of the input voltage, and enabling a number of pumpcells coupled in cascade configuration corresponding to the selected voltage range. The method may include disabling and bypassing at least one pumpcell based on the selected voltage range. The method may include disabling at least one pumpcell and providing the input voltage to a next pumpcell. The method may include disabling at least one pumpcell by disabling a clock signal. The method may include asserting a bypass signal to disable a pumpcell and to control a switch to provide the input voltage to an input of a next pumpcell. The method may include enabling a number of pumpcells and disabling remaining pumpcells. The method may include comparing a signal indicative of the output voltage with a reference signal and providing a clock enable signal indicative thereof, and disabling each pumpcell when the clock enable signal indicates that the output voltage has reached a predetermined voltage level.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims.

The invention claimed is:

1. A configurable multistage charge pump, comprising:
    a plurality of pumpcells coupled together in series, comprising a first pumpcell receiving an input voltage and at least one remaining pumpcell, wherein a last one of said at least one remaining pumpcell generates an output voltage;
    at least one bypass switch, each coupled to selectively provide said input voltage to a pumpcell input of a corresponding one of said at least one remaining pumpcell; and
    control logic, coupled to said plurality of pumpcells and to said at least one bypass switch, configured to determine one of a plurality of voltage ranges of said input voltage, to enable each of said plurality of pumpcells for a first voltage range of said plurality of voltage ranges and to disable and bypass at least one pumpcell for at least one other voltage range of said plurality of voltage ranges, wherein said control logic comprises a comparator which compares a signal indicative of said output voltage with a reference signal and which provides a clock enable signal indicative thereof to a clock enable input of each of said plurality of pumpcells.

2. The configurable multistage charge pump of claim 1, wherein said control logic disables said first pumpcell and controls a first bypass switch to provide said input voltage to said pumpcell input of a second pumpcell for a second voltage range of said plurality of voltage ranges.

3. The configurable multistage charge pump of claim 2, wherein said control logic disables said second pumpcell and controls a second bypass switch to provide said input voltage to said pumpcell input of a third pumpcell for a third voltage range of said plurality of voltage ranges.

4. The configurable multistage charge pump of claim 3, wherein said control logic disables said third pumpcell and controls a third bypass switch to provide said input voltage to said pumpcell input of a fourth pumpcell for a fourth voltage range of said plurality of voltage ranges.

5. The configurable multistage charge pump of claim 1, wherein said control logic disables each of a set of consecutively coupled pumpcells and controls said at least one bypass switch to provide said input voltage to said pumpcell input of a pumpcell following said set of consecutively coupled pumpcells for said at least one other voltage range of said plurality of voltage ranges.

6. The configurable multistage charge pump of claim 1, wherein said control logic provides a plurality of bypass signals, each selectively disabling a corresponding pumpcell and controlling a corresponding bypass switch to provide said input voltage to a next pumpcell in series.

7. The configurable multistage charge pump of claim 1, wherein each of said plurality of pumpcells comprises a switched capacitor for increasing voltage from said pumpcell input to a pumpcell output.

8. A method of operating a multistage charge pump, comprising:
  detecting an input voltage;
  selecting one of a plurality of voltage ranges based on a level of the input voltage;
  enabling a number of a plurality of pumpcells in cascade configuration corresponding to the selected voltage range; and
  comparing a signal indicative of an output voltage with a reference signal and providing a clock enable signal indicative thereof to a clock enable input of each of the plurality of pumpcells.

9. The method of claim 8, wherein said enabling a number of a plurality of pumpcells comprises disabling all but one of the plurality of pumpcells for a highest of the plurality of voltage ranges.

10. The method of claim 8, further comprising enabling all of the plurality of pumpcells for a lowest of the plurality of voltage ranges.

11. The method of claim 8, further comprising disabling and bypassing at least one of the plurality of pumpcells based on the selected voltage range.

12. The method of claim 8, further comprising disabling at least one of the plurality of pumpcells and providing the input voltage to a next one of the plurality of pumpcells in series.

13. The method of claim 8, further comprising disabling a consecutive set of at least two of the plurality of pumpcells and providing the input voltage to a next one of the plurality of pumpcells in series.

14. The method of claim 8, further comprising disabling at least one of the plurality of pumpcells by disabling a clock signal.

15. The method of claim 8, further comprising asserting a bypass signal to disable and bypass a corresponding one of the plurality of pumpcells.

16. The method of claim 8, further comprising asserting a bypass signal to disable a pumpcell and to control a switch to provide the input voltage to an input of a next pumpcell.

17. The method of claim 8, wherein said enabling a number of a plurality of pumpcells includes disabling remaining ones of the plurality of pumpcells.

18. The method of claim 8, further comprising:
  disabling all of the plurality of pumpcells when the clock enable signal indicates that the output voltage has reached a predetermined voltage level.

19. A processing system, comprising:
  a memory array;
  a configurable multistage charge pump system, configured to provide at least one output voltage level to said memory array, wherein selected stages of said multistage charge pump system are bypassed in accordance with a voltage level of an input supply voltage; and
  control logic comprising a comparator that compares a signal indicative of said at least one output voltage level with a reference signal and that provides a clock enable signal indicative thereof to a clock input of each of said stages of multistage pump system.

* * * * *